(12) United States Patent
Brekelmans

(10) Patent No.: US 8,378,720 B2
(45) Date of Patent: Feb. 19, 2013

(54) SIGNAL PROCESSING ARRANGEMENT

(75) Inventor: Johannes Hubertus Antonius Brekelmans, Nederweert (NL)

(73) Assignee: NXP B.V., Eindhoven (NL)

( * ) Notice: Subject to any disclaimer, the term of this patent is extended or adjusted under 35 U.S.C. 154(b) by 121 days.

(21) Appl. No.: 13/002,818

(22) PCT Filed: Jul. 7, 2009

(86) PCT No.: PCT/IB2009/052952
§ 371 (c)(1),
(2), (4) Date: Jan. 18, 2011

(87) PCT Pub. No.: WO2010/004508
PCT Pub. Date: Jan. 14, 2010

(65) Prior Publication Data
US 2011/0115539 A1    May 19, 2011

(30) Foreign Application Priority Data

Jul. 8, 2008    (EP) ..................... 08159890

(51) Int. Cl.
*H03B 19/00*    (2006.01)
(52) U.S. Cl. ........................ 327/117; 327/115
(58) Field of Classification Search ............. 327/115, 327/117
See application file for complete search history.

(56) References Cited

U.S. PATENT DOCUMENTS

| 5,914,996 | A * | 6/1999 | Huang | 377/39 |
| 6,795,837 | B1 * | 9/2004 | Wells | 708/3 |
| 2007/0176652 | A1 * | 8/2007 | Huott et al. | 327/115 |
| 2008/0013671 | A1 * | 1/2008 | Van De Beek et al. | 377/118 |

FOREIGN PATENT DOCUMENTS

| EP | 0 189 744 A | | 8/1986 |
| JP | 56 098030 | * | 8/1981 |
| JP | 56-098030 A | | 8/1981 |
| WO | 99/31805 A1 | | 6/1999 |
| WO | 2006/018754 A1 | | 2/2006 |

OTHER PUBLICATIONS

International Search Report and Written Opinion for Int'l. Patent Appln. No. PCT/IB2009/052952 (Oct. 15, 2009).

* cited by examiner

*Primary Examiner* — Ryan Jager

(57) ABSTRACT

A signal processing arrangement comprises a series of latches (XDL, L1, L2) arranged as a clocked delay line (CDL) having a data input and a data output that are coupled to each other so as to form an inverting loop. An enable circuit (ACDL) allows or prevents a latch (L2) in the series of latches from changing state depending on whether, one clock cycle ago, the latch concerned received a given binary value or the inverse of that given binary 5 value, respectively, from the preceding latch (L1) in the series of latches. Such a circuit configuration allows a low-cost frequency division by an odd number with relatively small duty cycle errors.

14 Claims, 5 Drawing Sheets

SIGNAL PROCESSING ARRANGEMENT

FIELD OF THE INVENTION

An aspect of the invention relates to a signal processing arrangement wherein a frequency division is carried out. The signal processing arrangement may be in the form of, for example, an integrated circuit that is capable of carrying out a frequency conversion. Such integrated circuits are typically applied in a front-end module of a receiver. Other aspects of the invention relate to a receiver system and a method of signal processing, which involves a frequency division.

BACKGROUND OF THE INVENTION

There are various types of signal processing that may involve a frequency division by an odd number. Frequency synthesis is an example. A frequency division by 3, 5, or 7, and so on, may be desired for generating a signal at a particular frequency, or for generating a signal having particular characteristics, or both. A controllable frequency divider, which is capable of providing closely spaced even and odd frequency division ratios, such as, for example, 2, 3, 4, 5, 6, and 7, may be used to advantage in a frequency synthesis system. Such a controllable frequency divider can provide an output signal that can be tuned over a relatively wide frequency range on the basis of an input signal that can be tuned over a relatively small frequency range only. Accordingly, it is possible to achieve a relatively wide tuning range, without this requiring an oscillator having a relatively wide tuning range.

Frequency division by an odd number can also used to advantage in radiofrequency systems that comprise a so-called harmonic rejection mixer. A harmonic rejection mixer effectively multiplies an input signal with a composite mixer driver signal, which is made up of individual square-wave-like signal components. The individual square-wave-like signal components have a particular magnitude, frequency, and phase relationship with respect to each other. This particular magnitude, frequency and phase relationship allows suppression of one or more of harmonic frequency components in the composite mixer driver signal, which would otherwise cause significant spurious responses. Achieving this particular frequency and phase relationship may involve at least one frequency division by an odd number.

In numerous applications, such as frequency synthesis and harmonic rejection mixing as discussed hereinbefore, it is desired that a frequency division by an odd number produces an output signal that has a 50% duty cycle. Such an output signal may also be in the form of a pair of signals, which have a 180° phase relationship. What matters is that the output signal comprises transitions that are equidistantly spaced in time. Such a 50% duty cycle signal allows generating precise in-phase and quadrature signals, in the sense that these signals have a precise 90° in phase relationship with respect to each other. In practice, an output signal will suffer from a duty cycle error: a deviation from the ideal of equidistantly spaced transitions. A duty cycle error, for example, will cause a phase error between the in-phase and quadrature signals, which will adversely affect signal processing quality. In a harmonic rejection mixer, a duty cycle error may adversely affect the suppression of one or more of harmonic frequency components.

International patent application published under number WO 2006/018754 describes a frequency-division circuit capable of providing a frequency division by an odd number and producing an output signal that has a small duty cycle error. The frequency-division circuit comprises a pair of multi-state circuits, each of which can be switched throughout a cycle of states. One multi-state circuit switches to a next state in response to a rising edge in an input signal. The other multi-state circuit switches to a next state in response to a falling edge in the input signal. Each multi-state circuit has at least one state in which the multi-state circuit inhibits the other multi-state circuit so as to prevent the other multi-state circuit from switching to the next state. Although the frequency-division circuit allows satisfactory signal processing quality, implementations are relatively costly because two multi-state circuits are required.

SUMMARY OF THE INVENTION

There is a need for low-cost circuits that allow a frequency division by an odd number with relatively small duty cycle errors.

In order to better address this need, a signal processing circuit in accordance with the invention has the following characteristics. The signal processing arrangement comprises a series of latches arranged as a clocked delay line having a data input and a data output that are coupled to each other so as to form an inverting loop. An enable circuit allows or prevents a latch in the series of latches from changing state depending on whether, one clock cycle ago, the latch concerned received a given binary value or the inverse of that given binary value, respectively, from the preceding latch in the series of latches.

The following holds for all latches within the clocked delay line, except for the latch concerned. In case a transition, which may be a rising edge or a falling edge, occurs at the data input of a latch, this transition will occur at the output of the latch with a delay of approximately one half clock cycle. However, the aforementioned applies only to one of the two aforementioned types of transition for the latch concerned. In case the other type of transition occurs at the data input of the latch concerned, there is an additional delay because the latch concerned is prevented from changing state. The latch concerned must wait one clock cycle counting from the occurrence of the transition concerned in order to be allowed to change state. That is, for one of the two possible transitions, a rising edge or a falling edge, the latch concerned effectively introduces an additional delay of one clock cycle.

Consequently, in case the enable circuit is active, the clocked delay line provides different delays depending on whether a rising edge or a falling edge travels, as it were, through the clocked delay line. In case the clocked delay line provides a delay of N/2 clock cycles for a rising edge, the clocked delay line provides a delay of N/2+1 clock cycles for a falling edge, and vice versa, N being an integer representing the number of latches that are active within the clocked delay line. As a result, the clocked delay line will effectively provide a frequency division by an odd number. More specifically, the clocked delay line generates a signal having a frequency that is N+1 times lower than that of a clock signal used to clock the clocked delay line. What is more, a supplementary signal having the same frequency can be derived from the rate at which the latch concerned is allowed or prevented from changing state. This supplementary signal has a relatively precise 180° phase relationship with respect to the aforementioned signal, which is taken from the clocked delay line. Accordingly, a relatively small duty cycle error can be obtained, which contributes to achieving satisfactory signal processing quality as explained hereinbefore.

A frequency-division circuit in accordance with the present invention typically requires fewer elements than the frequency-division circuit described in the aforementioned international patent application. Nonetheless, a comparable performance can be achieved. For example, a frequency-division circuit in accordance with the invention can be obtained by adding two latch circuits to a conventional series of latches arranged as a clocked delay line, which is capable of providing a frequency division by an even number.

An implementation of the invention advantageously comprises one or more of the following additional features, which are described in separate paragraphs that correspond with individual dependent claims.

The enable circuit preferably comprises an additional series of latches arranged as an additional clocked delay line having a data input and a data output. The data input is coupled to a data output of a latch in the first-mentioned series of latches. The data output of the additional clocked delay line is coupled to an enable input of said latch concerned in the first-mentioned series of latches, which is allowed or prevented from changing state if a given binary value or the inverse of that given binary value, respectively, is present at the enable input.

The additional clocked delay line preferably comprises two latches between its data input and its data output, whereby the data input is coupled to a data output of said preceding latch in the first-mentioned series of latches.

Said preceding latch in the first-mentioned series of latches preferably has a pair of outputs, which are inverting with respect to each other. One output is coupled to a data input of said latch concerned in the first-mentioned series of latches. The other output of the preceding latch is coupled to the data input of the additional clocked delay line.

The enable circuit is preferably switchable to an idle state wherein the enable circuit cannot prevent said latch concerned in the first-mentioned series of latches from changing state. This allows odd and even frequency division ratios.

Preferably, at least one latch in the additional series of latches has a reset input. The additional series of latches is arranged so that, when a reset signal is applied to the reset input, the given binary value is present at the enable input of said latch concerned in the first-mentioned series of latches, which is thereby allowed to change state.

Said latch concerned in the first-mentioned series of latches preferably comprises a reset input. The latch that provides the data output of the additional clock line comprises a reset input. The aforementioned reset inputs are coupled to each other so that the aforementioned latches can be simultaneously reset. This allows a well-defined initial state to be imposed.

A pair of clock lines is preferably provided for receiving a differential clock signal having a non-inverted component and an inverted component. One clock line is arranged to apply the non-inverted component to respective clock inputs of a set of respective latches. The other clock line is arranged to apply the inverted component of the differential clock signal to respective clock inputs of another set of respective latches. This obviates the need for inverters for inverting a clock signal.

The latches are preferably of the D-type.

A flip-flop circuit of the JK-type having a pair of data inputs may be provided. One data input is coupled to a data output of said latch concerned in the first-mentioned series of latches. The other data input of the flip-flop circuit is coupled to the enable input of said latch concerned in the first-mentioned series of latches.

An oscillator may be provided for generating a clock signal that drives the series of latches.

In addition, a mixer circuit may be provided for multiplying an input signal with at least one mixer driver signal, and a mixer driver circuit for generating the at least one mixer driver signal at least partially on the basis of a signal taken from the series of latches.

A detailed description, with reference to drawings, illustrates the invention summarized hereinbefore as well as the additional features.

DETAILED DESCRIPTION OF THE DRAWINGS

Figure 1:
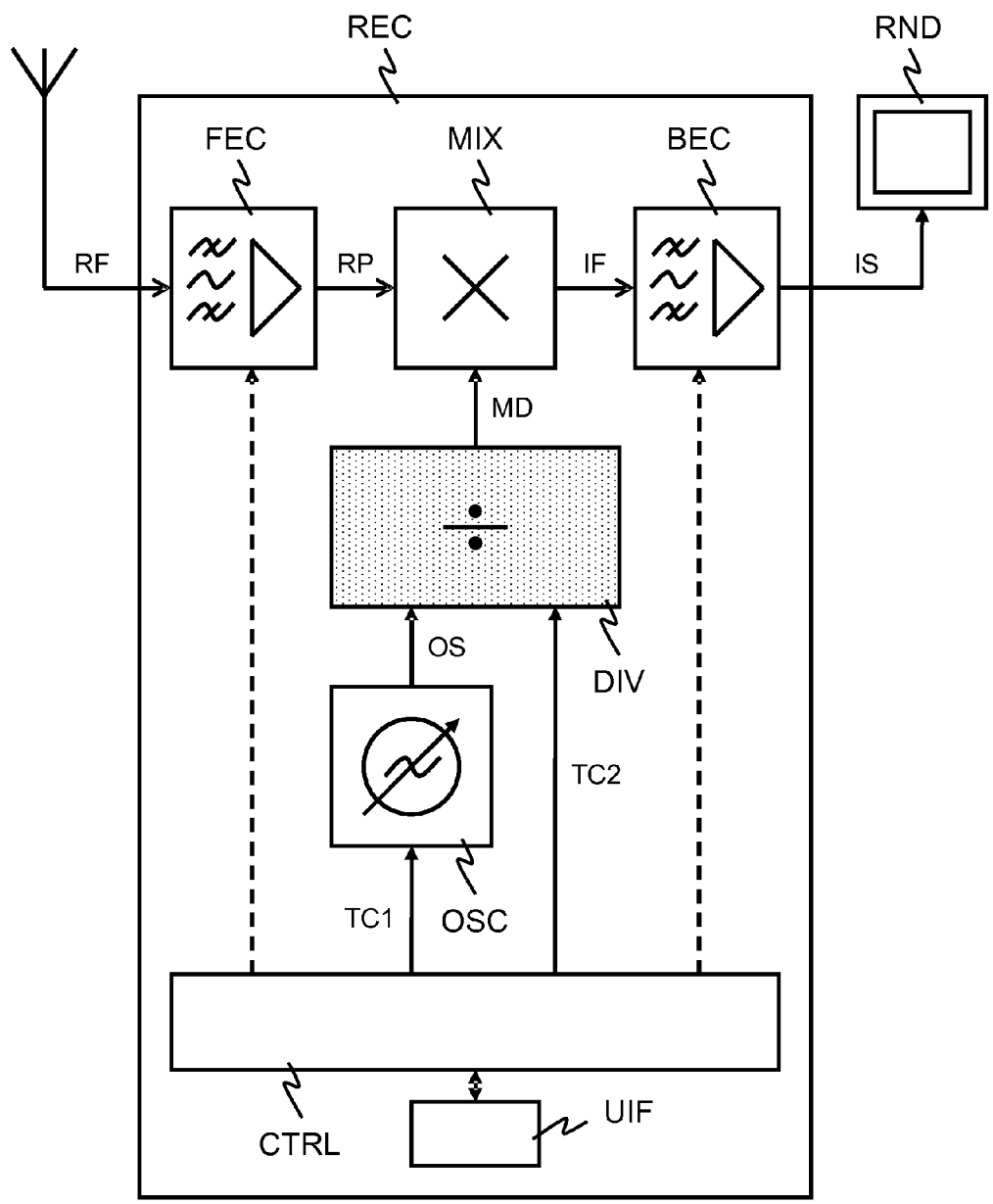
FIG. 1 is a block diagram that illustrates a receiver system.

FIG. 1 illustrates a receiver system that comprises a receiver REC and a rendering device RND. The receiver REC receives a radiofrequency signal RF by means of, for example, an antenna or a cable connection. The receiver REC extracts an information signal IS from the radiofrequency signal RF. In response to the information signal IS, the rendering device RND provides perceptible information, audibly or visually, or both.

The receiver REC comprises a front-end circuit FEC, a mixer MIX, and a backend circuit BEC, which constitute a processing path that can be tuned to a channel. The receiver REC further comprises an oscillator OSC, a frequency-division circuit DIV, and a controller CTRL, which may be regarded as a tuning system. The controller CTRL may receive user commands from a user interface UIF, which may comprise a remote-control device. The user interface UIF may further comprise, for example, a display, which indicates the channel to which the receiver REC is tuned. The display may form part of the rendering device RND.

The receiver REC basically operates as follows. Let it be assumed that the receiver REC is tuned to a particular channel, which will be referred to as desired channel hereinafter. The front-end circuit FEC filters and amplifies the radiofrequency signal RF so as to obtain a processed radiofrequency signal RP, which comprises an amplified version of the desired channel. Other channels are preferably attenuated with respect to the desired channel. Relatively simple filter circuits can attenuate channels that are relatively remote in frequency from the desired channel.

The mixer MIX receives a mixer driver signal MD, which causes the mixer MIX to convert the processed radiofrequency signal RP into an intermediate frequency signal IF. More specifically, the mixer driver signal MD causes the mixer MIX to shift the desired channel in frequency so as to obtain a frequency-shifted version thereof, which falls within a predefined intermediate frequency pass band. The backend circuit BEC suppresses signals that are outside the predefined intermediate frequency pass band. Only the frequency-shifted version of the desired channel is retained. The backend circuit BEC applies various types of processing to the frequency-shifted version of the desired channel so as to extract the information signal IS there from. These various types of processing may include, for example, amplification, demodulation, demultiplexing, decoding, and error correction.

A user may tune the receiver REC to the desired channel in the following fashion. The user designates the desired channel by means of the user interface UIF. In response, the controller CTRL applies tuning control signals TC1 and TC2 to the oscillator OSC and the frequency-division circuit DIV, respectively. Tuning control signals TC1 causes the oscillator OSC to provide an oscillator signal OS having a particular frequency, which will be referred to as oscillator frequency hereinafter. Tuning control signals TC2 causes the frequency-division circuit DIV to divide this particular frequency by a particular number which will be referred to as frequency division ratio hereinafter.

Accordingly, the mixer driver signal MD, which the frequency-division circuit DIV provides, has a frequency that is equal to the oscillator frequency divided by the frequency division ratio. The frequency of the mixer driver signal MD will be referred to as mixing frequency hereinafter. As explained hereinbefore, the mixer MIX carries out a frequency shift. The mixing frequency defines this frequency shift. The controller CTRL sets the oscillator frequency and the frequency division ratio so that the frequency-shifted version of the desired channel falls within the predefined intermediate frequency pass band.

In practice, the mixer MIX may frequency shift channels other than the desired channel within the predefined intermediate frequency pass band. Such a frequency shift constitutes a spurious response, which may degrade reception of the desired channel. These spurious responses can be reduced, or attenuated, by careful design of the mixer MIX and, what is more, by ensuring that the mixer driver signal MD has appropriate characteristics.

In this respect, the frequency-division circuit DIV plays an important role. For example, the mixer driver signal MD preferably comprises an in-phase component and a quadrature component, which have a 90° phase relationship. The mixer MIX preferably comprises two mixer circuits, one of which receives the in-phase component, the other receiving the quadrature component. Such a mixer MIX structure allows reducing, or attenuating, spurious responses. The better the mixer driver signal MD approximates the 90° phase relationship, the greater the extent to which spurious responses will be reduced, or attenuated.

Figure 2:
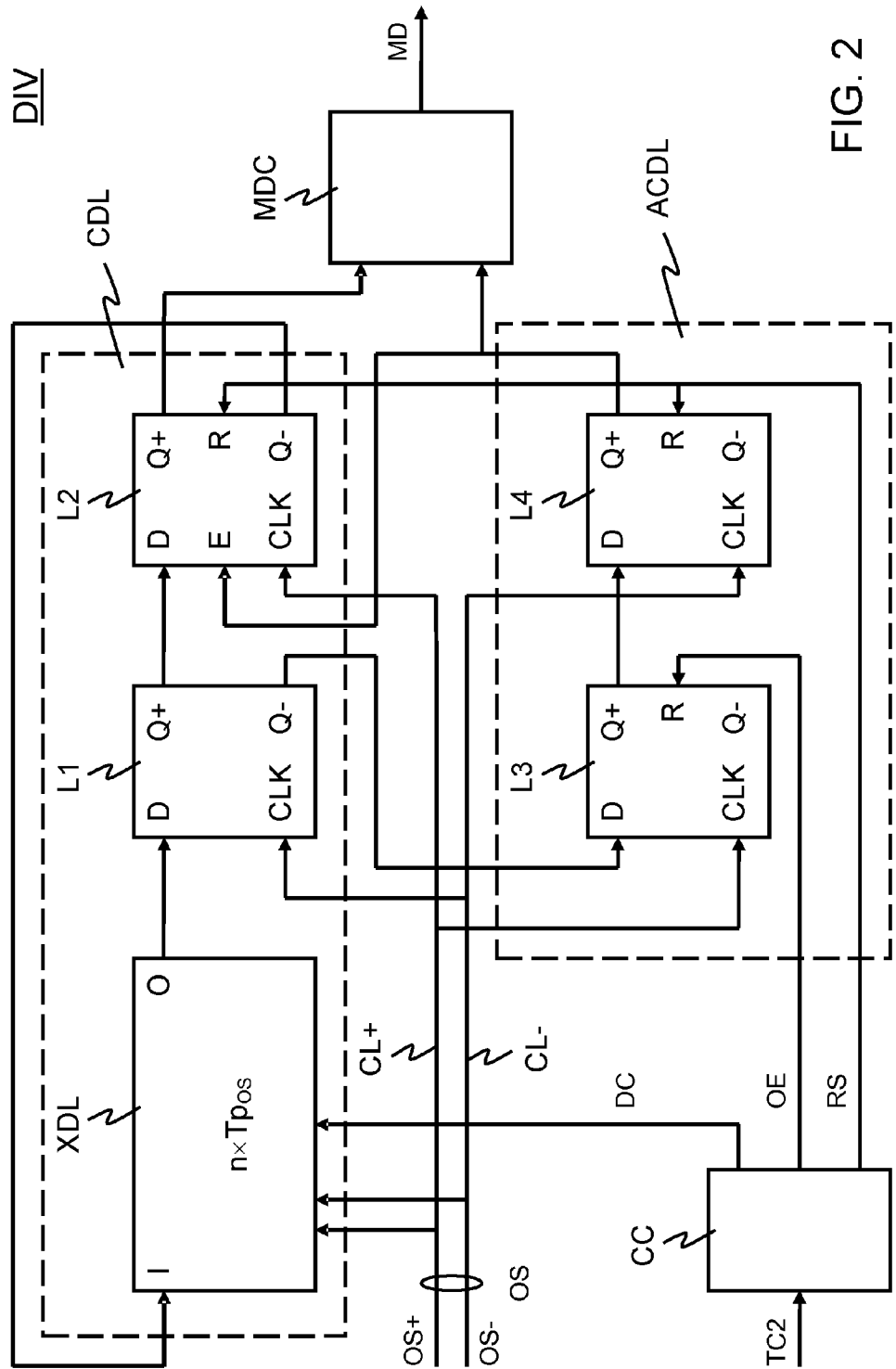
FIG. 2 is a block diagram that illustrates a frequency divider, which forms part of the receiver system.

FIG. 2 illustrates the frequency-division circuit DIV. The frequency-division circuit DIV comprises a clocked delay line CDL, an additional clocked delay line ACDL, a mixer driver circuit MDC, and a control circuit CC. In more detail, the clocked delay line CDL comprises a controllable delay portion XDL followed by two latches L1, L2 of the D-type. The controllable delay portion XDL has a data input I and a data output O. The additional clocked delay line ACDL comprises two latches of the D- type L3, L4. Each latch has a data input D, a clock input CLK, a non-inverting data output Q+, and an inverting data output Q−. Latch L2 has an enable input E. Latches L2 and L4 each have a reset input R.

It should be noted that the clocked delay line CDL has a data input that corresponds with the data input I of the controllable delay portion XDL. The clocked delay line CDL has a data output that corresponds with the inverting data output of latch L2. The data output of the clocked delay line CDL is coupled to its data input so as to form an inverting loop. The additional clocked delay line ACDL has a data input and a data output that correspond with the data input of latch L3 and the non-inverting data output of latch L4, respectively. The additional clocked delay line ACDL is coupled between the inverting data output of latch L1 and the enable input of latch L2, which form part of the clocked delay line CDL.

The frequency-division circuit DIV receives the oscillator signal OS and tuning control signal TC2 from the oscillator OSC and the controller CTRL, respectively, illustrated in FIG. 1. The oscillator signal OS is in the form of a differential signal, which has a non-inverted component OS+ and an inverted component OS−. The frequency-division circuit DIV comprises a pair of clock lines, one CL+ for the non-inverted component OS+ of the oscillator signal OS, the other clock line CL− being for the inverted component OS−. The pair of clock lines CL+, CL− applies the oscillator signal OS to the controllable delay portion XDL and the respective clock inputs of aforementioned latches L1-L4. More specifically, latch L1 receives the inverted component OS− of the oscillator signal OS, whereas latch L2 receives the non-inverted component OS+. Latch L3 receives the non-inverted component OS+ of the oscillator signal OS, whereas latch L4 receives the inverted component OS−.

The frequency-division circuit DIV operates as follows. The control circuit CC provides various internal control signals on the basis of tuning control signals TC: a delay control signal DC, and odd/even control signal OE, and a reset signal RS. The delay control signal DC defines a delay between the data input I and the data output O of the controllable delay portion XDL. This delay corresponds with an integer number of cycles of the oscillator signal OS, whereby the aforementioned integer number depends on the delay control signal DC. These cycles of the oscillator signal OS, which may also be designated as periods of the oscillator signal OS, are referred to as clock cycles hereinafter. The delay control signal DC also defines a delay between the data input and the data output of the clocked delay line CDL. This delay is one clock cycle more than the delay of the controllable delay portion XDL. This is because, in combination, latches L1, L2 introduce a delay corresponding to one clock cycle, which adds to the delay of the controllable delay portion XDL.

The odd/even control signal OE, which latch L3 receives at its reset input, determines whether the additional clocked delay line ACDL of which latch L3 forms part is enabled (active) or inhibited (idle). More specifically, the odd/even control signal OE enables the additional clocked delay line ACDL by allowing latch L3 to change state. The odd/even control signal OE inhibits the additional delay line ACDL by forcing latch L3 to provide binary value 1 at its non-inverting data output. Accordingly, latch L4 is also forced to provide binary value 1 at its non-inverting data output, which constitutes the data output of the additional clocked delay line ACDL.

The reset signal RS serves to ensure that the frequency-division circuit DIV is in a well-defined state following, for example, a change in tuning control signal TC2. To that end, latches L2 and L4 jointly receive the reset signal RS at their respective reset inputs. That is, the aforementioned reset inputs are coupled to each other as illustrated in FIG. 2 so that latches L2 and L4 can simultaneously be reset by means of the reset signal RS.

Let it be assumed that the control circuit CC inhibits the additional clocked delay line ACDL by means of the odd/even control signal OE, which is applied to the reset input of latch L3. In that case, latch L2 receives binary value 1 at its enable input so that this latch is allowed to change state, irrespective of a value present at the data input of the additional clocked delay line ACDL. As a result, the frequency-division circuit DIV provides an even frequency division ratio. This even frequency division ratio is equal to two times the delay of the clocked delay line CDL in terms of number of clock cycles. In case the controllable delay portion XDL does not introduce any delay, in other words zero delay, the even frequency division ratio is equal to two (2). In case the delay of the controllable delay portion XDL is equal to one clock cycle, the even frequency division ratio is equal to four (4). In case the aforementioned delay is equal to two clock cycles, the even frequency division ratio is equal to six (6), and so on. As explained hereinbefore, the delay control signal DC effectively defines the frequency division ratio.

Let it now be assumed that the control circuit CC enables the additional clocked delay line ACDL by means of the odd/even control signal OE. In that case, the inverse of a binary value that is present at the data input of latch L2, will occur at the enable input of the same latch one clock cycle later. This is because the additional clocked delay line ACDL is coupled between the inverting data output of latch L1 and the enable input of latch L2, as illustrated in FIG. 2. In effect, the additional clocked delay line ACDL constitutes an enable circuit that allows or prevents latch L2 from changing state depending on whether, one clock cycle ago, latch L2 received binary value 0 or binary value 1, respectively, and its data input. As a result, the frequency-division circuit DIV provides an odd frequency division ratio. This would equally be the case when replacing latch L4 by a latch used for L2 having an additional enable input that is driven by the non-inverting output of latch L2. In that case appropriate measures may need to be taken in order to prevent latch up.

Let it be assumed that the additional clocked delay line ACDL is enabled and that a 0 to 1 transition, which corresponds with a rising edge, occurs at the data input of latch L2 at a given instant. This means that, one clock cycle ago, binary value 0 was present at the data input of latch L2. The additional clocked delay line ACDL causes the inverse of the binary value that was present at the data input of latch L2 to be present at the enable input of this latch. Consequently, binary value 1 will be present at the enable input of latch L2 when the 0 to 1 transition occurs. This means that latch L2 is enabled. The 0 to 1 transition, which occurs at the data input of latch L2, will occur at its data output with a standard delay corresponding to half a clock cycle. There is no additional delay.

Let it now be assumed that the additional clocked delay line ACDL is enabled and that a 1 to 0 transition, which corresponds with a rising edge, occurs at the data input of latch L2 at a given instant. This means that, one clock cycle ago, binary value 1 was present at the data input of this latch. The additional clocked delay line ACDL causes the inverse of the binary value that was present at the data input of latch L2 to be present at the enable input of this latch. Consequently, binary value 0 will be present at the enable input of latch L2 when the 1 to 0 transition occurs. This means that latch L2 is inhibited. Latch L2 will not transfer the 1 to 0 transition to its data output with the standard delay of half a clock cycle. The 1 to 0 transition will occur at the data output with an additional delay corresponding to one clock cycle. This is because binary value 1 will be present at the enable input of latch L2 one clock cycle after the occurrence of the 1 to 0 transition at the data input of latch L2. In effect, the additional clocked delay line ACDL transfers the inverse of the 1 to 0 transition, which is a 0 to 1 transition, from the data input of latch L2 to the enable input of this latch with one clock cycle in delay. In the mean time, the additional clocked delay line ACDL prevents latch L2 from changing state.

In summary, in the frequency-division circuit DIV illustrated in FIG. 2, a 0 to 1 transition experiences a standard delay within the clocked delay line CDL. This standard delay is equal to the delay experienced by any transition, 0 to 1 or 1 to 0, in case the additional delay line is inhibited and the frequency-division circuit DIV provides an even frequency division ratio. In case the additional clocked delay line ACDL is enabled, a 1 to 0 transition experiences an additional delay of one clock cycle, which causes the frequency-division circuit DIV to provide an odd frequency division ratio. That is, one clock cycle additional delay is selectively introduced for 1 to 0 transitions. It should be noted that, in case the additional clocked delay line ACDL was coupled between the non-inverting data output of latch L1 and the enable input of latch L2, one clock cycle additional delay would selectively be introduced for 0 to 1 transitions.

Figure 3:
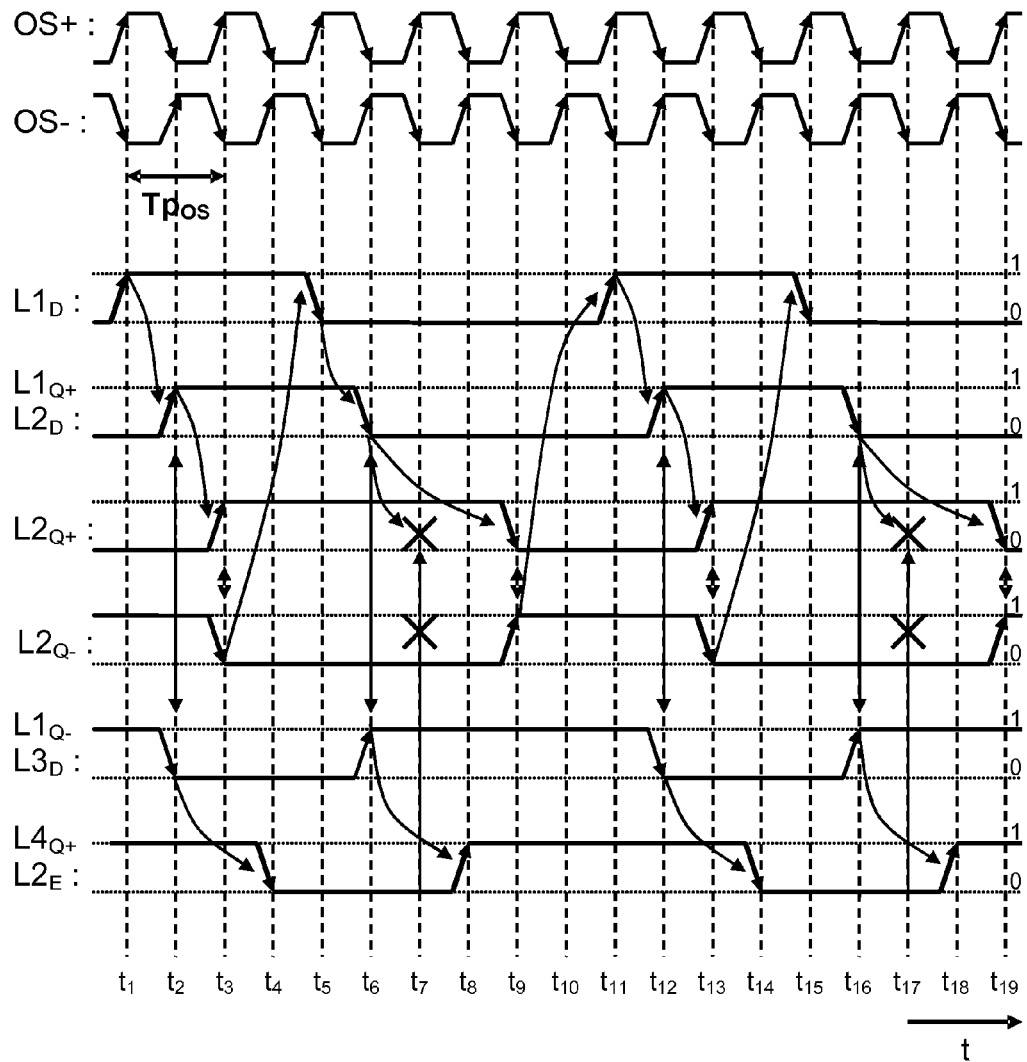
FIG. 3 is a time diagram that illustrates state changes of various latches in the frequency divider.

FIG. 3 illustrates various signals within the frequency-division circuit DIV in case the following two conditions apply. The delay of the controllable delay portion XDL is equal to one clock cycle. The additional clocked delay line ACDL is enabled so as to obtain an odd frequency division ratio, which is equal to five (5).

FIG. 3 is a time diagram having a horizontal axis that represents time. A series of instants t1-t19 are indicated on the horizontal axis, each of which corresponds with a transition in the oscillator signal OS. The instants t1-t19 are equidistantly spaced on a grid of one half a clock cycle. A clock cycle $Tp_{OS}$ corresponds with a time interval between two subsequent transitions of an identical type, which may be falling edges, or rising edges.

The time diagram of FIG. 3 comprises respective horizontal sections, each illustrating a particular signal. Horizontal sections OS+ and OS− illustrate the non-inverted component OS+ and the inverted component OS− of the oscillator signal OS, respectively. Horizontal section $L1_D$ illustrates a signal present at the data input of latch L1. Horizontal section $L1_{Q+}$ $L2_D$ illustrates a signal present at the non-inverting data output of latch L1, which corresponds with a signal present at the data input of latch L2. Horizontal section $L2_{Q+}$ illustrates a signal at the non-inverting data output of latch L2. Horizontal section $L2_{Q-}$ illustrates a signal present at the inverting data output of latch L2. Horizontal section $L1_{Q-}$ $L3_D$ illustrates a signal present at the inverting data output of latch L1, which corresponds with a signal present at the data input of latch L3. Finally, horizontal section $L4_{Q+}$ $L2_E$ illustrates a signal present at the non-inverting data output of latch L4, which corresponds with a signal present at the enable input of latch L2.

A 0 to 1 transition, which constitutes a rising edge, occurs at the data input of latch L1 at instant t1. This rising edge occurs one half clock cycle later at the non-inverting data output of latch L1 and the data input of latch L2 at instant t2, and one clock cycle later at the non-inverting data output of latch L2 at instant t3. At the same instant, t3, a falling edge occurs at the inverting data output of latch L2. This falling edge travels, as it were, through the controllable delay portion XDL illustrated in FIG. 2 so as to occur at the data input of latch L1 with one clock cycle delay at instant t5. The falling edge occurs one half clock cycle later at the non-inverting output of latch L1 and the data input of latch L2 at instant t6.

The falling edge, which occurs the data input of latch L2 at instant t6, occurs 1½ clock cycle later at the non-inverting output of latch L2, at instant t9. This is in contrast with the rising edge that occurs at the data input of latch L2 at instant t2, which occurs half a clock cycle later at the data output of the same latch, at instant t3. There is an additional delay of one clock cycle because latch L2 is inhibited at instant t7, which is marked by a cross. More precisely, latch L2 is inhibited during a time interval that extends from instant t4 to instant t8. This is because during this time interval binary value 0 is present at the enable input of latch L2, as illustrated in the lower horizontal section of FIG. 3. As mentioned hereinbefore, the enable input of latch L2 is coupled to the data output of the additional clocked delay line ACDL, which corresponds with the non-inverting data output of latch L4.

The additional clocked delay line ACDL inhibits latch L2 during the time interval t4-t8 as a result of the following. The rising edge that occurs at the data input of latch L2 at instant t2 coincides with a falling edge at the inverting data output of latch L1. This falling edge, which occurs at instant t2, is also present at the data input of latch L3, which constitutes the data input of the additional clocked delay line ACDL. The falling edge travels through the additional clocked delay line ACDL and occurs one clock cycle later, which means at instant t4, at its data output, which is formed by the non-inverting data output of latch L4. Since the falling edge constitutes a 1 to 0 transition, the enable input of latch L2 receives binary value 1 before instant t4 and receives binary value 0 after instant t4 until instant t8, when a 0 to 1 transition occurs at the enable input of latch L2 as illustrated in FIG. 3.

FIG. 3 shows that the signal illustrated in horizontal section $L4_{Q+}$, $L2_E$, which is present at the enable input of latch L2, is an inverted and delayed version of the signal illustrated in horizontal section $L1_{Q+}$, $L2_D$, which is present at the data input of latch L2. The delay is one clock cycle. This is because the additional clocked delay line ACDL transfers the inverse of the signal that is present at the data input of latch L2 to the enable input of this latch with a delay equal to one clock cycle. Consequently, at any given instant, the enable input of latch L2 receives a binary value that is the inverse of the binary value that was present at the data input of this latch one clock cycle ago. In case a 0 to 1 transition occurs at the data input of latch L2, this implies that the data input of this latch L2 received binary value 0 one clock cycle ago. Since the enable input of latch L2 receives the inverse of a binary value that is present at the data input of this latch one clock cycle ago, this further implies that latch L2 receives binary value 1 at its enable input when the 0 to 1 transition occurs. Latch L2 is enabled when the 0 to 1 transition occurs. Conversely, latch L2 receives binary value 0 at its enable input when a 1 to 0 transition occurs at its data input. Latch L2 is inhibited.

More specifically, in FIG. 3, a 1 to 0 transition occurs at the data input of latch L2 at instant t6. One clock cycle ago, at instant t4, the data input of latch L2 received binary value 1. Consequently, the enable input of latch L2 receives binary value 0, which is the inverse of binary value 1, when the 1 to 0 transition occurs at instant t6. Latch L2 is thus inhibited when the 1 to 0 transition occurs. This inhibition will effectively be removed after one clock cycle, at instant t8. This is because the additional clocked delay line ACDL causes an inverse transition, from 0 to 1, to occur at the enable input of latch L2 after one clock cycle at instant t8. That is, at instant t8, the binary value that the data input of latch L2 received one cycle ago, corresponding to instant t6, is equal to 0. Since the inverse of this binary value is present at the enable input of latch L2, latch L2 is enabled.

Conversely, a 0 to 1 transition occurs at the data input of latch L2 at instant t12. One clock cycle ago, at instant t10, the data input of latch L2 received binary value 0. Consequently the enable input of latch L2 receives binary value 1, which is the inverse of binary value 0, when the 0 to 1 transition occurs at instant t12. Latch L2 is thus enabled when the 0 to 1 transition occurs at instant t12. This 0 to 1 transition is a delayed version of the rising edge that occurs at the inverting data output of latch L2 at instant t9. This rising edge travels, as it were, through the controllable delay portion XDL and latch L1. Accordingly, the rising edge experiences a delay equal to 1½ clock cycle so as to produce the 0 to 1 transition at instant t12. Instant t12 can be regarded as the start of a cycle which it is identical to the cycle starting at instant t2 and ending at instant t12.

The signal at the non-inverting data output of latch L2, which is illustrated in horizontal section $L2_{Q+}$ in FIG. 3, and the signal at the non-inverting data output of latch L4, which is illustrated in horizontal section $L4_{Q+}$, $L2_E$ constitute a pair of frequency-divided signals that is applied to the mixer driver circuit MDC. Each of these signals has a frequency that is ⅕ of the frequency of the oscillator signal OS. The frequency division ratio is equal to 5. This is due to the fact that the controllable delay portion XDL provides one clock cycle delay and that the additional clocked delay line ACDL is enabled.

Importantly, the aforementioned frequency-divided signals are mutually phase shifted with respect to each other by 180°. This allows the mixer driver circuit MDC to generate mixer driver signal components, which have a precise 90° phase relationship. That is, the frequency-divided signals allow a precise phase quadrature relationship. This contributes to reducing spurious responses of the mixer MIX illustrated in FIG. 1, as mentioned hereinbefore. The mixer driver circuit MDC may be, for example, similar to the quadrature generation circuit illustrated in FIG. 13 of the international patent application published under number WO 2006/018754 mentioned hereinbefore.

Figure 4:
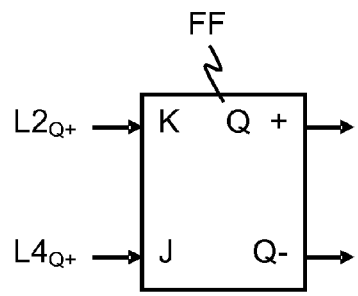
FIG. 4 is a block diagram that illustrates a flip-flop circuit, which may be included in the frequency divider.

FIG. 4 illustrates a flip-flop circuit FF of the JK type, which may form part of the mixer driver circuit MDC. The flip-flop circuit FF has a pair of data inputs J and K, respectively, a non-inverting data output Q+, and an inverting data output Q−. The K input is coupled to receive the signal $L2_{Q+}$ illustrated in horizontal section of FIG. 3, which is the signal from the non-inverting data output of latch L2 that constitutes the data output of the clocked delay line CDL. The J input is coupled to receive the signal illustrated in horizontal section $L4_{Q+}L2_E$ of FIG. 3, which is the signal from the non-inverting data output of latch L4 that constitutes the data output of the additional clocked delay line ACDL. The flip-flop circuit FF effectively combines the aforementioned pair of frequency-divided signals into a single output signal with a duty cycle that is precisely 50% provided that the oscillator signal OS also has a duty cycle that is precisely 50%.

Figure 5:
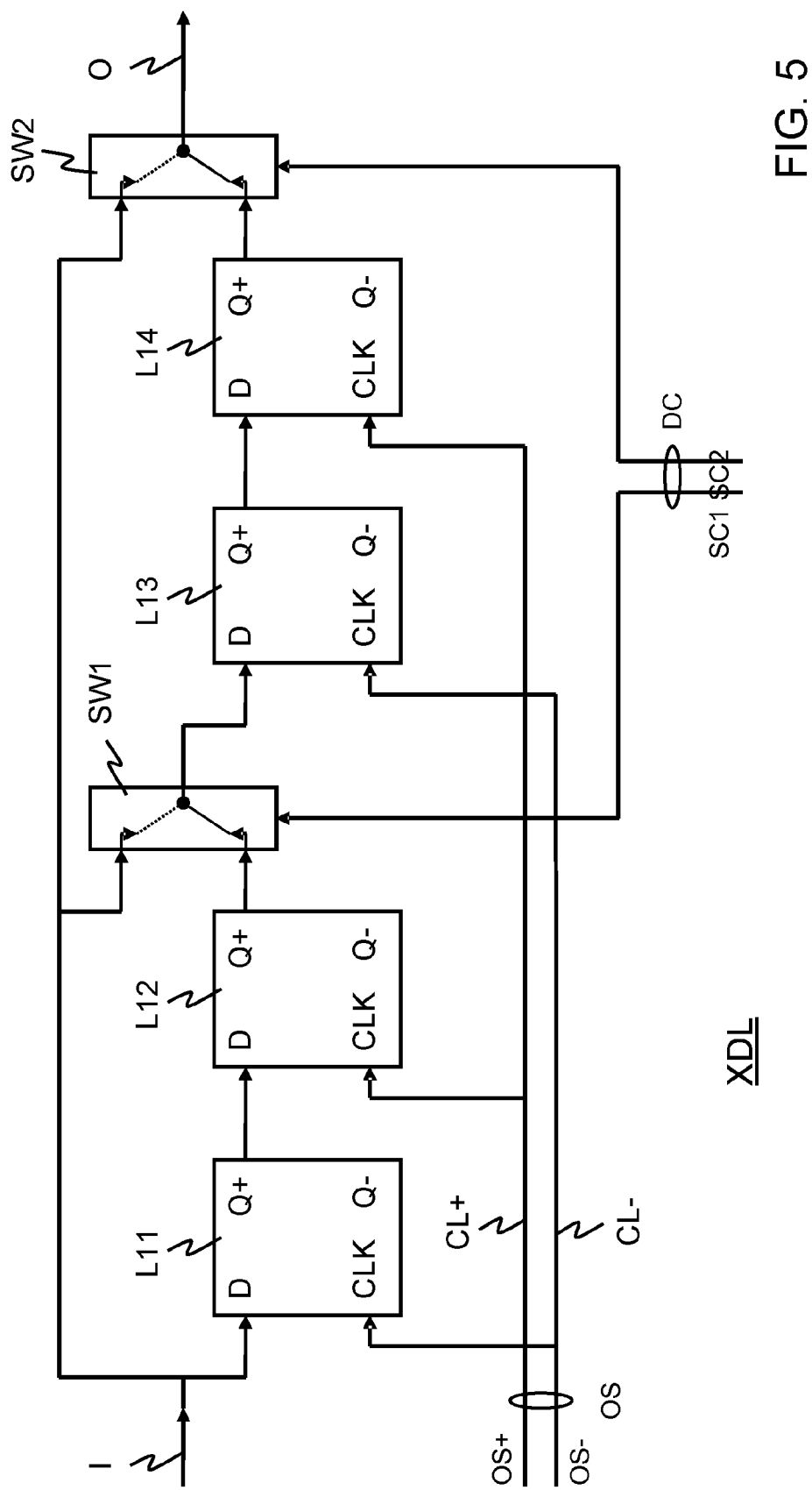
FIG. 5 is a block diagram that illustrates a controllable delay line portion, which forms part of the frequency divider.

FIG. 5 illustrates the controllable delay portion XDL, or rather an implementation thereof. The controllable clocked delay line CDL comprises four latches L11, L12, L13, L14 of D type and two switches SW1, SW2, which may equally be considered as multiplexers. Each latch has a data input D, a clock input CLK, a non-inverting data output Q+, and an inverting data output Q−. Each switch has two inputs and an output. The data input of latch L11 constitutes the data input I of the controllable delay portion XDL. The output of switch SW2 constitutes the output O of the controllable delay portion XDL. Latches L12 and L14 receive the non-inverted component OS+ of the oscillator signal OS at their respective clock inputs via clock line CL+. Latches L11, L13 receive the inverted component OS− of the oscillator signal OS at their respective clock inputs via clock line CL+. The delay control signal DC, which the control circuit CC illustrated in FIG. 2 provides, comprises two switch control signals SC1, SC2, one switch control signal SC1 for switch SW1, the other switch control signal SC2 for switch SW2.

The controllable delay portion XDL operates as follows. In combination, latches L11 and L12 constitute a flip-flop circuit FF of the D type that provides a delay of one clock. The same applies to latches L13 and L14. Switch SW1 can be in a delay-enabling state or in a bypass state depending on switch control signal SC1. Similarly, switch SW2 can be in a delay-enabling state or in a bypass state depending on switch control signal SC2. In the delay-enabling state, switch SW1 couples the data input of latch L13 to the non-inverting data output of latch L12. In the bypass state, switch SW1 couples the data input of latch L13 directly to the data input I of the controllable delay portion XDL. In the delay-enabling state, switch SW2 couples the output O of the controllable delay portion XDL to the non-inverting output of latch L14. In the bypass state, switch SW2 couples the output O of the controllable delay portion XDL directly to the data input I of the same.

Accordingly, the delay of the controllable delay portion XDL is equal to 0, one clock cycle, or two clock cycles, depending on the respective states of the two switches SW1, SW2, which are defined by means of the delay control signal DC. In case switch SW2 is in the bypass state, the data input I of the controllable delay portion XDL is directly coupled to the data output O of the same so that the delay is 0, irrespective of the state of switch SW1. Let it be assumed that switch SW2 is in the delay-enabling state. In that case, the delay is equal to one clock cycle or two clock cycles depending on whether switch SW1 is in the bypass state or in the delay-enabling state, respectively.

Figure 6:
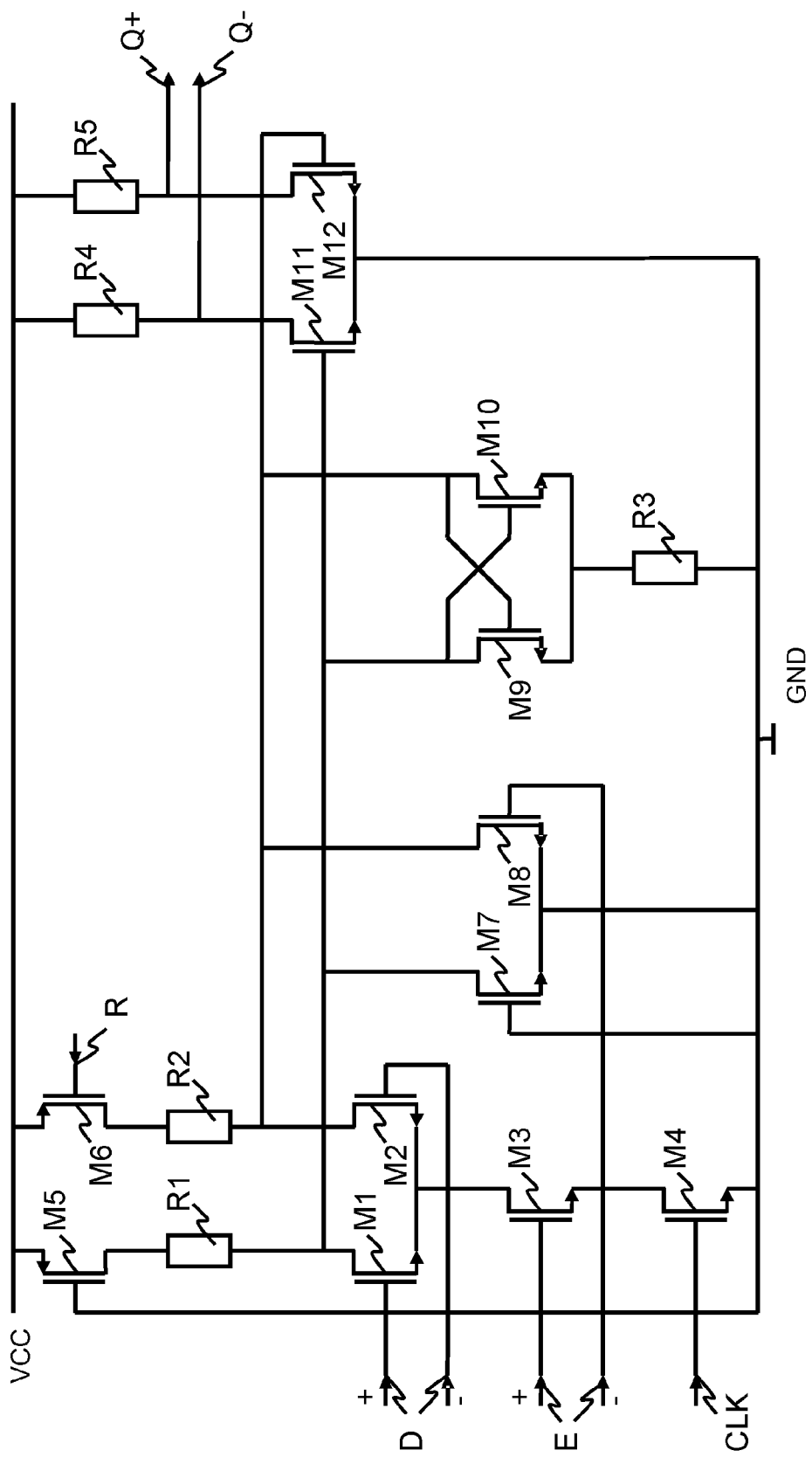
FIG. 6 is a circuit diagram that illustrates a latch that can be prevented from switching state, which forms part of the frequency divider.

FIG. 6 illustrates latch L2, or rather an implementation thereof. Latch L2 comprises several transistors M1-M12 and several resistances R1-R5. The transistors may be, for example, of the field-effect type, comprising a gate, a source, and a drain. Transistors M1 and M2 form an input differential pair. The respective gates of these transistors constitute the data input D of latch L2 in a differential form, comprising a non-inverting port+ and an inverting port−. The respective sources of transistors M1 and M2 are coupled to each other and coupled to signal ground via transistor M3 and transistor M4. The gate of transistor M3 constitutes a non-inverting port+ of the enable input E of latch L2, which enable input is in a differential form. The gate of transistor M4 constitutes the clock input CLK of latch L2. Resistances R1 and R2 and transistors M5 and M6 constitute a load circuit for the aforementioned differential pair formed by transistors M1 and M2. The gate of transistor M6 constitutes the reset input R of latch L2.

Transistors M7 and M8 constitute an auxiliary differential pair. The respective sources of these transistors are coupled to signal ground. The gate of transistor M7 is also coupled to signal ground, whereas the gate of transistor M8 constitutes an inverting port− of the enable input E of latch L2. The drain of transistor M7 is coupled to the drain of transistor M1, which is further coupled to resistance R1 and transistor M5 of the load circuit. The drain of transistor M8 is coupled to the drain of transistor M2, which is further coupled to resistance R2 and transistor M6 of the load circuit. The auxiliary differential pair formed by transistors M7 and M8 is thus effectively arranged in parallel with the input differential pair formed by transistors M1 and M2.

Transistors M9 and M10 constitute a data retention differential pair. The gate of transistor M9 is coupled to the drain of transistor M10. In a symmetrical fashion, the gate of transistor M10 is coupled to the drain of transistor M9. The drain of transistor M9 is coupled to the drain of transistor M1. The drain of transistor M10 is coupled to the drain of transistor M2. The respective sources of transistors M9 and M10 are jointly coupled to signal ground via resistance R3.

Transistors M11 and M12 constitute an output differential pair. The gate of transistor M11 is coupled to the respective drains of transistors M1, M7, and M9. The gate of transistor M12 is coupled to the respective drains of transistors M2, M8, and M10. The respective sources of transistors M11 and M12 and are jointly coupled to signal ground. Resistances R4 and R5, which are coupled to the drains of transistors M11 and M12, respectively, constitute a load circuit for the output differential pair. The drain of transistor M12 constitutes the non-inverting output Q+ of latch L2. The drain of transistor M11 constitutes the inverting output Q− of latch L.

Latch L2 operates as follows. The input differential pair M1, M2 is active only when transistors M3 and M4 are in a conductive state. This occurs when the clock input CLK receives binary value 1 and the non-inverting port of the enable input E receives binary value 1. In case the differential input pair is active, a binary value that is present at the non-inverting port+ of the data input D of latch L2, will be transferred to the non-inverting output Q+. The inverse of this binary value will be present at the inverting output Q−. Latch L2 is in a transparent state, which may also be referred to as open state. The data retention differential pair M9, M10 copies, as it were, the binary value that is present at the data input D of latch L2.

The differential input pair M1, M2 is idle when either transistor M3 or transistor M4 is in a non-conductive state. This occurs when either the clock input CLK receives binary value zero or the non-inverting port+ of the enable input E receives binary value 0. In case the differential input pair is idle, the data retention differential pair M9, M10 determines the respective binary values that are present at the non-inverting output Q+ and the inverting output Q− of latch L2. These respective binary values are in equal to the respective binary value that these outputs had at the most recent instant when the input differential pair was switched from an active state to an idle state. Latch L2 does not respond, as it were, to a binary value that is present at its state input. Latch L2 is in a hold state, which may also be referred to as a closed state. Latch L2 can thus be forced to in the hold state, irrespective of the binary value that is present at the clock input CLK, by applying binary value 0 to the non-inverting port+ of the enable input E. In effect, an "and" function is applied to a clock signal and an enable signal, so as to obtain an effective clock signal for latch L2. Transistors M3 and M4 implement this "and" function.

The auxiliary differential pair M7 and M8 contributes to a favorable high-frequency performance of latch L2. That is, latch L2 reacts relatively rapidly to a change at its enable input E.

Concluding Remarks

The detailed description hereinbefore with reference to the drawings is merely an illustration of the invention and the additional features, which are defined in the claims. The invention can be implemented in numerous different ways. In order to illustrate this, some alternatives are briefly indicated.

The invention may be applied to advantage in numerous types of products or methods that involve a frequency division. A receiver system is merely an example. The invention may equally the applied in, for example, a transmitter system, a transceiver system, or a measurement system, such as a spectrum analyzer.

The detailed description provides an example in which the enable circuit is in the form of a clocked delay line. Alternatively, the enable circuit may comprise a different type of delay circuit, which allows a determination of whether, one clock cycle ago, the latch of interest received a given binary value or the inverse of that given binary value. For example, referring to FIG. 2, latches L3 and L4 may be replaced by a circuit that provides a delay determined by physical properties of particular elements of the circuit, such as, for example, a resistance value and a capacitance value, which define a time constant. The delay need not necessarily be precisely one clock cycle.

What is more, the enable circuit may apply a delay of several clock cycles in order to make the aforementioned determination. For example, referring to FIGS. 2 and 5, the frequency-division circuit DIV may be modified as follows. Switch SW2 illustrated in FIG. 5 is removed. The data input of latch L3 is no longer coupled to the inverting output of latch L1, as illustrated in FIG. 2, but to the inverting output of latch L12 illustrated in FIG. 5 via two additional latches. That is, the additional clocked delay line ACDL is extended to produce a delay of two clock cycles. Nonetheless, the output of the thus extended additional clocked delay line ACDL indicates whether, one clock cycle ago, the data input of latch L2 received binary value 0 or 1. Notwithstanding the aforementioned, the frequency-division circuit DIV illustrated in FIGS. 2 and 5 is preferred because this implementation requires fewer latches than the modified version thereof described hereinbefore.

It should further be noted that there are numerous ways of inhibiting the enable circuit so as to obtain an even frequency division ratio. FIG. 2 illustrates an example in which the enable circuit is inhibited by means of an odd/even signal control OE that is applied to the reset input R of latch L3. As another example, the odd/even control signal OE may also be applied to latch L4, which may comprise a supplementary reset input for that purpose.

The given binary value one which the aforementioned determination is based, may either be 0 or 1. For example, referring to FIG. 2, the frequency-division circuit DIV will equally provides an odd frequency division ratio in case the data input of the additional clocked delay line ACDL is coupled to the non-inverting data output of latch L1. In that case, rising edges will experience an additional delay of one clock cycle instead of falling edges as illustrated in FIG. 3. It may be necessary to take certain precautions in order to prevent latch up. Referring to FIG. 2 latch L2 may be replaced by a latch that does not have any enable input. In that case, an enable/inhibit function may be achieved by means of an AND gate in front of the clock input of the last mentioned latch, whereby one input port of the AND gate receives the non-inverted oscillator signal component OS+, whereas another input port is coupled to the non-inverting output of latch L4.

The term "latch" should be understood in a broad sense. The term includes any type of circuit that can be switched between an open state, in which an output value may vary as a function of an input value, and a closed state, in which the circuit maintains the output value that most recently applied in the open state.

In broad terms, there are numerous ways of implementing functional entities by means of hardware or software, or a combination of both. In this respect, the drawings are very diagrammatic. Although a drawing shows different functional entities as different blocks, this by no means excludes implementations in which a single entity carries out several functions, or in which several entities carry out a single function. For example, referring to FIG. 5, switch SW1 and latch L13 may be combined to form an adapted latch L circuit, which has multiplexed inputs.

The remarks made herein before demonstrate that the detailed description with reference to the drawings, illustrate rather than limit the invention. There are numerous alternatives, which fall within the scope of the appended claims. Any reference sign in a claim should not be construed as limiting the claim. The word "comprising" does not exclude the presence of other elements or steps than those listed in a claim. The word "a" or "an" preceding an element or step does not exclude the presence of a plurality of such elements or steps. The mere fact that respective dependent claims define respective additional features, does not exclude a combination of additional features, which corresponds to a combination of dependent claims.

The invention claimed is:

1. A signal processing arrangement comprising:
   a series of latches arranged as a clocked delay line having a data input and a data output that are coupled to each other so as to form an inverting loop; and
   an enable circuit arranged to one of allow and prevent a latch in the series of latches from changing state depending on whether, one clock cycle ago, the latch concerned received a given binary value or an inverse of that given binary value, respectively, from the preceding latch in the series of latches, wherein the enable circuit includes an additional series of latches arranged as an additional clocked delay line having a data input and a data output, the data input being coupled to a data output of a latch in the first-mentioned series of latches, the data output of the additional clocked delay line being coupled to an enable input of said latch concerned in the first-mentioned series of latches.

2. A signal processing arrangement according to claim 1, wherein the latches are D-type.

3. A signal processing arrangement according to claim 1, further comprising an oscillator for generating a clock signal that drives the series of latches.

4. A signal processing arrangement comprising:
   a series of latches arranged as a clocked delay line having a data input and a data output that are coupled to each other so as to form an inverting loop; and
   an enable circuit arranged to one of allow and prevent a latch in the series of latches from changing state depending on whether, one clock cycle ago, the latch concerned received a given binary value or an inverse of that given binary value, respectively, from the preceding latch in the series of latches, the enable circuit including an additional series of latches arranged as an additional clocked delay line having a data input and a data output, the data input being coupled to a data output of a latch in the first-mentioned series of latches, the data output of the additional clocked delay line being coupled to an enable input of said latch concerned in the first-mentioned series of latches, which is one of allowed and prevented from changing state if a given binary value or an inverse of that given binary value, respectively, is present at the enable input.

5. A signal processing arrangement according to claim 4, the additional clocked delay line comprising two latches between its data input and its data output, wherein the data input is coupled to a data output of said preceding latch in the first-mentioned series of latches.

6. A signal processing arrangement according to claim 5, said preceding latch in the first-mentioned series of latches having a pair of outputs, which are inverting with respect to each other, one output being coupled to a data input of said latch concerned in the first-mentioned series of latches, the other output of the preceding latch being coupled to the data input of the additional clocked delay line.

7. A signal processing arrangement according to claim 4, at least one latch in the additional series of latches having a reset input, the additional series of latches being arranged so that, when a reset signal is applied to the reset input, the given binary value is present at the enable input of said latch concerned in the first-mentioned series of latches, which is thereby allowed to change state.

8. A signal processing arrangement according to claim 4, wherein said latch concerned in the first-mentioned series of latches comprises a reset input, and wherein the latch that provides the data output of the additional clock line comprises a reset input, the aforementioned reset inputs being coupled to each other so that the aforementioned latches can be simultaneously reset.

9. A signal processing arrangement according to claim 6, further comprising a JK-type flip-flop circuit having a pair of data inputs, one data input being coupled to a data output of said latch concerned in the first-mentioned series of latches, the other data input of the flip-flop circuit being coupled to the enable input of said latch concerned in the first-mentioned series of latches.

10. A signal processing arrangement comprising:
a series of latches arranged as a clocked delay line having a data input and a data output that are coupled to each other so as to form an inverting loop; and
an enable circuit arranged to one of allow and prevent a latch in the series of latches from changing state depending on whether, one clock cycle ago, the latch concerned received a given binary value or an inverse of that given binary value, respectively, from the preceding latch in the series of latches, the enable circuit being switchable to an idle state wherein the enable circuit cannot prevent said latch concerned in the first-mentioned series of latches from changing state.

11. A signal processing arrangement, comprising:
a series of latches arranged as a clocked delay line having a data input and a data output that are coupled to each other so as to form an inverting loop; and
an enable circuit arranged to one of allow and prevent a latch in the series of latches from changing state depending on whether, one clock cycle ago, the latch concerned received a given binary value or an inverse of that given binary value, respectively, from the preceding latch in the series of latches, further comprising a pair of clock lines for receiving a differential clock signal having a non-inverted component and an inverted component, one clock line being arranged to apply the non-inverted component to respective clock inputs of a set of respective latches, the other clock line being arranged to apply the inverted component of the differential clock signal to respective clock inputs of another set of respective latches.

12. A signal processing arrangement comprising:
a series of latches arranged as a clocked delay line having a data input and a data output that are coupled to each other so as to form an inverting loop;
an enable circuit arranged to one of allow and prevent a latch in the series of latches from changing state depending on whether, one clock cycle ago, the latch concerned received a given binary value or an inverse of that given binary value, respectively, from the preceding latch in the series of latches; and
a mixer circuit for multiplying an input signal with at least one mixer driver signal; and
a mixer driver circuit for generating the at least one mixer driver signal at least partially based on a signal taken from the series of latches.

13. A receiver system comprising:
a signal processing circuit according to claim 12; and
a backend circuit for processing an output signal of the mixer circuit so as to obtain an information signal that can be applied to a rendering device.

14. A method of signal processing involving a first series of latches, which are arranged as a clocked delay line having a data input and a data output that are coupled to each other so as to form an inverting loop, the method comprising:
an enabling step in which a latch within the first series of latches is one of allowed and prevented from changing state depending on whether, one clock cycle ago, the latch concerned received a given binary value or the inverse of that given binary value, respectively, from the preceding latch in the series of latches; and
using an additional series of latches arranged as an additional clocked delay line having a data input and a data output, wherein the data input is coupled to a data output of a latch in the first series of latches, the data output of the additional clocked delay line is coupled to an enable input of said latch concerned in the first-mentioned series of latches.

* * * * *